(12) United States Patent
Pisek et al.

(10) Patent No.: US 9,634,693 B2
(45) Date of Patent: Apr. 25, 2017

(54) APPARATUS AND METHOD FOR DECODING LDPC CODES IN A COMMUNICATIONS SYSTEM

(75) Inventors: Eran Pisek, Plano, TX (US); Shadi Abu-Surra, Richardson, TX (US); Thomas M. Henige, Plano, TX (US)

(73) Assignee: SAMSUNG ELECTRONICS CO., LTD, Suwon-si, Gyeonggi-Do (KR)

( * ) Notice: Subject to any disclaimer, the term of this patent is extended or adjusted under 35 U.S.C. 154(b) by 1175 days.

(21) Appl. No.: 13/248,900

(22) Filed: Sep. 29, 2011

(65) Prior Publication Data

US 2012/0084625 A1 Apr. 5, 2012

Related U.S. Application Data

(60) Provisional application No. 61/390,085, filed on Oct. 5, 2010, provisional application No. 61/439,514, filed on Feb. 4, 2011, provisional application No. 61/453,428, filed on Mar. 16, 2011.

(51) Int. Cl.
| | |
|---|---|
| H03M 13/00 | (2006.01) |
| H03M 13/31 | (2006.01) |
| H03M 13/03 | (2006.01) |
| H03M 13/11 | (2006.01) |

(52) U.S. Cl.
CPC ......... *H03M 13/31* (2013.01); *H03M 13/033* (2013.01); *H03M 13/114* (2013.01); *H03M 13/116* (2013.01); *H03M 13/118* (2013.01); *H03M 13/1137* (2013.01)

(58) Field of Classification Search
USPC ................................ 714/758, 781
See application file for complete search history.

(56) References Cited

U.S. PATENT DOCUMENTS

| | | | |
|---|---|---|---|
| 5,583,500 A * | 12/1996 | Allen et al. | .................... 341/107 |
| 6,854,082 B1 * | 2/2005 | Rhee | ............................. 714/755 |
| 7,334,181 B2 | 2/2008 | Eroz et al. | |
| 7,343,539 B2 | 3/2008 | Divsalar et al. | |
| 7,480,845 B2 | 1/2009 | Kim et al. | |
| 7,499,490 B2 | 3/2009 | Divsalar et al. | |
| 7,734,988 B2 | 6/2010 | Kim et al. | |
| 7,890,844 B2 | 2/2011 | Jeong et al. | |

(Continued)

FOREIGN PATENT DOCUMENTS

| | | | |
|---|---|---|---|
| KR | 1020070035283 A | 3/2007 | |
| KR | 1020090093763 A | 9/2009 | |

(Continued)

OTHER PUBLICATIONS

Office Action dated Jul. 19, 2013 in connection with U.S. Appl. No. 13/159,091.

(Continued)

*Primary Examiner* — M. Mujtaba Chaudry

(57) ABSTRACT

An apparatus and method decode LDPC code. The apparatus includes a memory and a number of LDPC processing elements. The memory is configured to receive a LDPC codeword having a length equal to a lifting factor times a base LDPC code length, wherein the lifting factor is greater than one. The number of LDPC processing elements configured to decode the LDPC codeword, wherein each of the number of LDPC processing elements decode separate portions of the LDPC codeword.

9 Claims, 11 Drawing Sheets

(56) References Cited

U.S. PATENT DOCUMENTS

| | | | |
|---|---|---|---|
| 7,966,548 B2 | 6/2011 | Jacobsen et al. | |
| 7,984,368 B2 | 7/2011 | Pisek et al. | |
| 8,006,162 B2 | 8/2011 | Choi et al. | |
| 8,117,523 B2 | 2/2012 | Divsalar et al. | |
| 8,132,072 B2 | 3/2012 | El-Khamy et al. | |
| 8,161,363 B2 | 4/2012 | Jeong et al. | |
| 8,209,592 B2 | 6/2012 | Pisek et al. | |
| 8,239,746 B2 | 8/2012 | Divsalar et al. | |
| 8,386,906 B2 | 2/2013 | Shen et al. | |
| 2006/0203765 A1 | 9/2006 | Laroia et al. | |
| 2006/0294445 A1 | 12/2006 | Divsalar et al. | |
| 2007/0043998 A1 | 2/2007 | Lakkis | |
| 2007/0094568 A1 | 4/2007 | Choi et al. | |
| 2007/0162815 A1 | 7/2007 | El-Khamy et al. | |
| 2008/0126916 A1 | 5/2008 | Chung et al. | |
| 2008/0178065 A1* | 7/2008 | Khandekar et al. | 714/801 |
| 2009/0013239 A1 | 1/2009 | Blanksby | |
| 2009/0063933 A1* | 3/2009 | Richardson et al. | 714/763 |
| 2009/0070659 A1 | 3/2009 | Zhong et al. | |
| 2009/0300461 A1* | 12/2009 | Shor et al. | 714/752 |
| 2010/0080187 A1 | 4/2010 | Papasakellariou et al. | |
| 2010/0098012 A1 | 4/2010 | Bala et al. | |
| 2010/0165931 A1 | 7/2010 | Nimbalker et al. | |
| 2010/0226269 A1 | 9/2010 | Chakraborty et al. | |
| 2010/0238823 A1 | 9/2010 | Chen et al. | |
| 2011/0047433 A1 | 2/2011 | Abu-Surra et al. | |
| 2011/0066916 A1 | 3/2011 | Abu-Surra et al. | |
| 2011/0299484 A1 | 12/2011 | Nam et al. | |
| 2011/0307760 A1 | 12/2011 | Pisek et al. | |
| 2012/0084625 A1 | 4/2012 | Pisek et al. | |
| 2012/0240001 A1 | 9/2012 | Abu-Surra et al. | |

FOREIGN PATENT DOCUMENTS

| | | |
|---|---|---|
| KR | 1020100032346 A | 3/2010 |
| KR | 1020100047155 A | 5/2010 |

OTHER PUBLICATIONS

International Search Report dated May 31, 2011 in connection with International Patent Application No. PCT/KR2010/006362.

Written Opinion of the International Searching Authority dated May 31, 2011 in connection with International Patent Application No. PCT/KR2010/006362.

Sunghwan Kim, et al., "Quasi-Cyclic Low-Density Parity-Check Codes With Girth Larger Than 12", IEEE Transactions on Information Theory, vol. 53, No. 8, Aug. 2007, p. 2885-2891.

Eran Sharon, et al., "Generating Good Finite Length LDPC Codes Based on Lifted Graphs", Forty-Fourth Annual Allerton Conference, Sep. 27-29, 2006, p. 41-50.

Gianluigi Liva, et al., "Design of LDPC Codes: A Survey and New Results", J. Comm. Software and Systems, Sep. 2006, 22 pages.

N. Jacobsen, et al., "Design of rate-compatible irregular LDPC codes based on edge growth and parity splitting", in Proc. IEEE Vehicular Technology Conference (VTC); 30 2007; Oct. 3, 2007, p. 1052-1056.

H-G Joo, et al., "New Construction of Rate-Compatible Block-Type Low-Desity Parity-Check Codes Using Splitting", Proc. IEEE (PIMRC 2006), Sep. 2006, 5 pages.

Notification of Transmittal of the International Search Report and the Written Opinion of the International Searching Authority dated Feb. 10, 2012 in connection with International Patent Application No. PCT/KR2011/004351.

Written Opinion of the International Searching Authority dated Feb. 23, 2012 in connection with International Patent Application No. PCT/KR2011/004051.

International Search Report dated Feb. 23, 2012 in connection with International Patent Application No. PCT/KR2011/004051.

"3rd Generation Partnership Project; Technical Specification Group Radio Access Network; Evolved Universal Terrestrial Radio Access (E-UTRA); Ohysical Channels and Modulation (Release 9)", 3GPP TS 36.211 v9.1.0, Mar. 2010, 85 pages.

Andrew Blanksby, et al., "LDPC Code Set for mmWave Communication", mmCom '10, Sep. 24, 2010, p. 39-43.

Office Action dated Nov. 7, 2013 in connection with U.S. Appl. No. 13/115,900.

Notice of Allowance dated Jan. 2, 2014 in connection with U.S. Appl. No. 13/159,091.

Notice of Allowance dated Oct. 22, 2014 in connection with U.S. Appl. No. 13/115,900.

\* cited by examiner

FIG. 5b
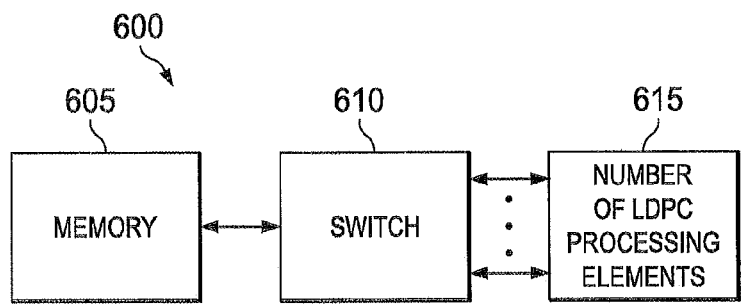
FIG. 6
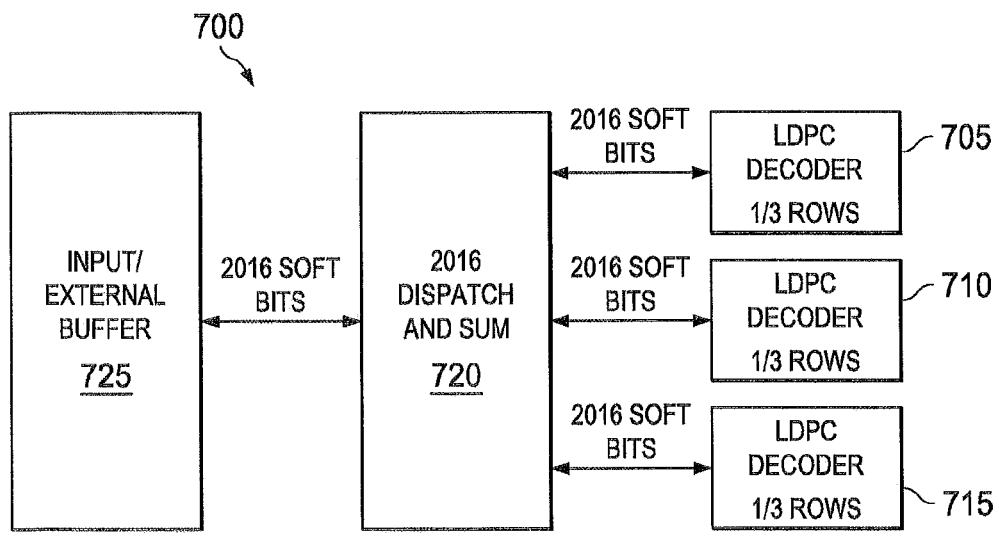
FIG. 7

1600 a) RATE 1/2

| -1 | 0  | 0  | 0  | 0  | -1 | 0  | -1 | 0  | -1 | -1 | -1 | -1 | -1 | -1 | -1 |
|----|----|----|----|----|----|----|----|----|----|----|----|----|----|----|----|
| -1 | -1 | 2  | -1 | -1 | 0  | 6  | 0  | 8  | 0  | -1 | -1 | -1 | -1 | -1 | -1 |
| 0  | -1 | 4  | -1 | -1 | 5  | 12 | 7  | 16 | 9  | 0  | -1 | -1 | -1 | -1 | -1 |
| 0  | 1  | -1 | 3  | 4  | -1 | -1 | -1 | -1 | -1 | 25 | 0  | -1 | -1 | -1 | -1 |
| 0  | 2  | -1 | 6  | -1 | -1 | 18 | 14 | 24 | -1 | -1 | 11 | 0  | -1 | -1 | -1 |
| 0  | -1 | -1 | -1 | -1 | 10 | -1 | 21 | -1 | -1 | 23 | 22 | 26 | 0  | -1 | -1 |
| -1 | 3  | -1 | 9  | 8  | -1 | -1 | -1 | -1 | -1 | -1 | -1 | 25 | 13 | 0  | -1 |
| -1 | -1 | 6  | -1 | 12 | 15 | -1 | -1 | -1 | 18 | -1 | -1 | -1 | 26 | 21 | 0  |

FIG. 16a

1605 a) RATE 5/8

| 0  | 0  | 0  | 0  | 0  | 0  | 0  | 0  | 0  | 0  | -1 | -1 | -1 | -1 |
|----|----|----|----|----|----|----|----|----|----|----|----|----|----|
| 0  | 1  | -1 | -1 | -1 | -1 | 6  | -1 | 8  | 9  | 25 | 0  | -1 | -1 | -1 |
| -1 | -1 | 2  | 3  | 4  | -1 | -1 | 7  | 16 | 18 | -1 | 11 | 0  | -1 | -1 |
| 0  | 2  | 4  | 6  | 8  | 5  | 12 | 14 | 24 | -1 | -1 | 22 | 26 | 0  | -1 |
| -1 | -1 | 6  | 9  | 12 | 10 | -1 | 21 | -1 | -1 | -1 | -1 | 25 | 13 | 0  | -1 |
| 0  | 3  | -1 | -1 | -1 | 15 | 18 | -1 | -1 | -1 | 23 | -1 | -1 | 26 | 21 | 0  |

FIG. 16b

1610 a) RATE 3/4

| 0 | 0 | 0 | 0 | 0 | 0 | 0 | 0 | 0 | 0 | 0 | 0 | 0 | -1 | -1 | -1 |
|---|---|---|---|---|---|---|---|---|---|---|---|---|----|----|----|
| 0 | 1 | 2 | 3 | 4 | 5 | 6 | 7 | 8 | 9 | 25 | 11 | -1 | 0 | -1 | -1 |
| 0 | 2 | 4 | 6 | 8 | 10 | 12 | 14 | 16 | 18 | -1 | -1 | 26 | 13 | 0 | -1 |
| 0 | 3 | 6 | 9 | 12 | 15 | 18 | 21 | 24 | -1 | 23 | 22 | 25 | 26 | 21 | 0 |

APPARATUS AND METHOD FOR DECODING LDPC CODES IN A COMMUNICATIONS SYSTEM

CROSS-REFERENCE TO RELATED APPLICATION(S) AND CLAIM OF PRIORITY

The present application is related to U.S. Provisional Patent Application No. 61/390,085, filed Oct. 5, 2010, entitled "METHOD AND APPARATUS FOR GIGABIT RATE ACHIEVING LOW-POWER LDPC DECODER ARCHITECTURE"; U.S. Provisional Patent Application No. 61/439,514, filed Feb. 4, 2011, entitled "REDUCED COMPLEXITY SHIFT ARCHITECTURE FOR LDPC DECODER"; and U.S. Provisional Patent Application No. 61/453,428, filed Mar. 16, 2011, entitled "HIGH THROUGHPUT LOW POWER LDPC DECODER AND CODE DESIGN". Provisional Patent Application No. 61/390,085; 61/439,514 and 61/453,428 are assigned to the assignee of the present application and is hereby incorporated by reference into the present application as if fully set forth herein. The present application hereby claims priority under 35 U.S.C. §119(e) to U.S. Provisional Patent Application No. 61/390,085; 61/439,514 and 61/453,428.

The present application is also related to U.S. patent application Ser. No. 12/855,442, filed on Aug. 12, 2010, and entitled "SYSTEM AND METHOD FOR STRUCTURED LDPC CODE FAMILY WITH FIXED CODE LENGTH AND NO PUNCTURING"; U.S. patent application Ser. No. 12/876,903, filed on Sep. 7, 2010, and entitled "SYSTEM AND METHOD FOR STRUCTURED LDPC CODE FAMILY"; and U.S. patent application Ser. No. 13/159,091, filed on Jun. 13, 2011, and entitled "METHOD AND APPARATUS FOR PARALLEL PROCESSING IN A GIGABIT LDPC DECODER". U.S. patent application Ser. Nos. 12/855,442, 12/876,903, and 13/159,091 are assigned to the assignee of the present application and are hereby incorporated by reference into the present application as if fully set forth herein.

TECHNICAL FIELD OF THE INVENTION

The present application relates generally to communications devices and, more specifically, to encoding and decoding data transmitted between communication devices.

BACKGROUND OF THE INVENTION

The rise of high definition and 3D media, the vision of hyper-connectivity, and the shift toward cloud computing have prompted the need for gigabit wireless communication systems. However, implementing high data-rate systems poses a number of engineering challenges. One of the main challenging problems is the design of a high throughput error control scheme.

Low density parity check (LDPC) codes are channel codes used in forward error correcting (FEC) schemes. LDPC codes are well known for their good performance and have received a great deal of attention in recent years. This is due to their ability to achieve performance close to the Shannon limit, the ability to design codes which achieve high parallelization in hardware, and their support of high data rates. Consequently, many of the currently active telecommunication standards have LDPC codes in their physical layer FEC scheme.

As data rates in modern communication systems and battery-powered mobile communication and computing devices usage increase, low-power hardware design has become more important. As a result, there is continuing work in the area of improving the power-efficiency and throughput of LDPC encoding and decoding hardware.

SUMMARY OF THE INVENTION

An apparatus for decoding a LDPC code is provided. The apparatus includes a memory and a number of LDPC processing elements. The memory is configured to receive a LDPC codeword having a length equal to a lifting factor times a base LDPC code length, wherein the lifting factor is greater than one. The number of LDPC processing elements configured to decode the LDPC codeword, wherein each of the number of LDPC processing elements decode separate portions of the LDPC codeword.

A method for decoding LDPC code is provided. The method includes receiving a LDPC codeword having a length equal to a lifting factor times a base LDPC code length. The lifting factor is greater than one. The method includes decoding, using the number of LDPC processing elements, the LDPC codeword. Each of the number of LDPC processing elements decode separate portions of the LDPC codeword.

An apparatus for decoding LDPC code is provided. The apparatus includes a pre-shift module configured to apply a pre-shift values to the LDPC code prior to the LDPC code being decoded using a decoding loop. The apparatus includes a relative-shift module in the decoding loop. The relative-shift module is configured to apply relative-shift values to layers of the LDPC code in the decoding loop. The apparatus includes a check-node processor in the decoding loop. The check-node processor configured to iteratively process the layers of the LDPC code. The apparatus includes a post-shift module configured to apply post-shift values to the LDPC code after processing in the decoding loop.

A method for constructing LDPC code is provided. The method includes determining a protograph for the LDPC code, identifying a number of relative-shift values per column of the LDPC code, identifying a value for each of the number of relative-shift values for each column; and constructing a base matrix for the LDPC code. The base matrix is constructed by replacing each zero in the protograph with a '−1'; calculating a corresponding value for an absolute shift of each one in the protograph based on the number of relative-shift values per column, the value for each of the number of relative-shift values, and a Z-factor for the LDPC code; and replacing each one in the protograph with the corresponding value.

A method for decoding LDPC code is provided. The method includes applying relative-shift values to layers of the LDPC code and iteratively processing the layers of the LDPC code. Each column of the LDPC code is constrained to a number of relative shifts.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 4a-b illustrate LDPC code lifted by a lifting factor of two according to the present disclosure;

FIGS. 5a-b illustrate LDPC code lifted by a lifting factor of three according to the present disclosure;

FIG. 6 illustrates a block diagram of a LDPC decoder present disclosure;

FIG. 7 illustrates a block diagram of LDPC decoder architecture for a flooding method of decoding according to the present disclosure;

FIGS. 16a-16c illustrate a LDPC code family having a single relative shift and different code rates.

DETAILED DESCRIPTION OF THE INVENTION

FIGS. 1 through 16c, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communications system.

Figure 1:
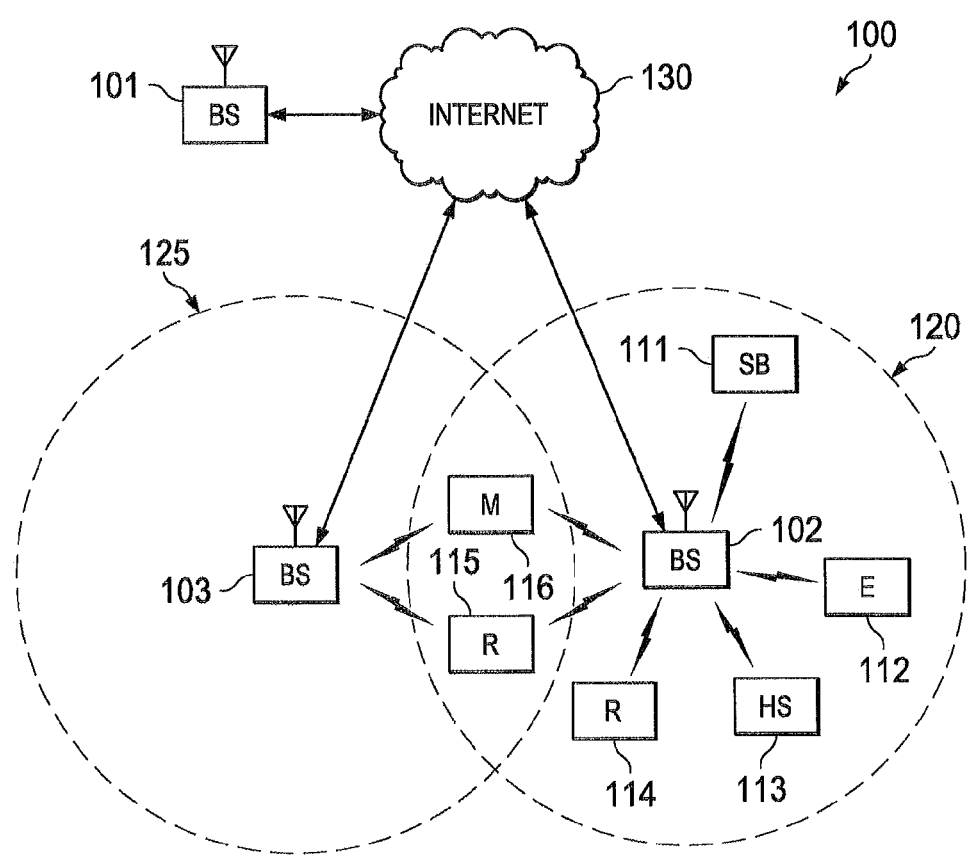
FIG. 1 illustrates an exemplary wireless system which transmits messages according to the present disclosure.
Figure 2:
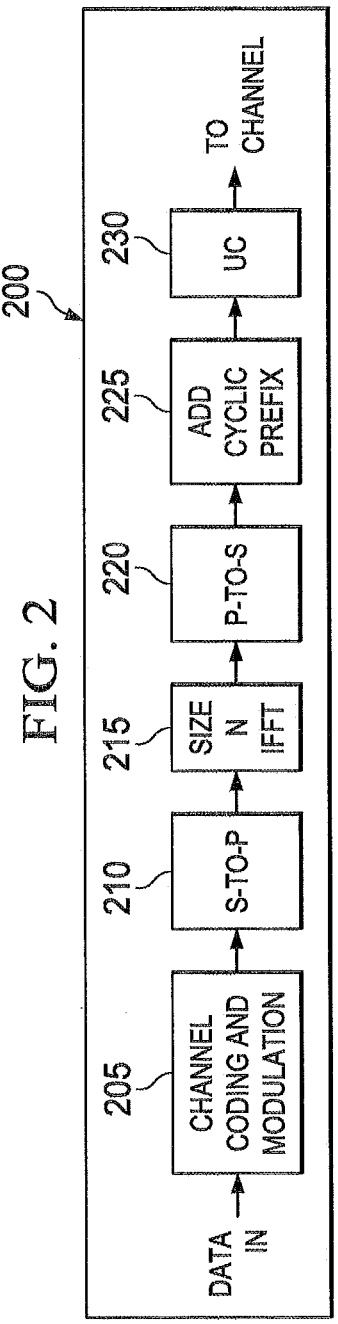
FIG. 2 illustrates a high-level diagram of an orthogonal frequency division multiple access transmit path according to the present disclosure.
Figure 3:
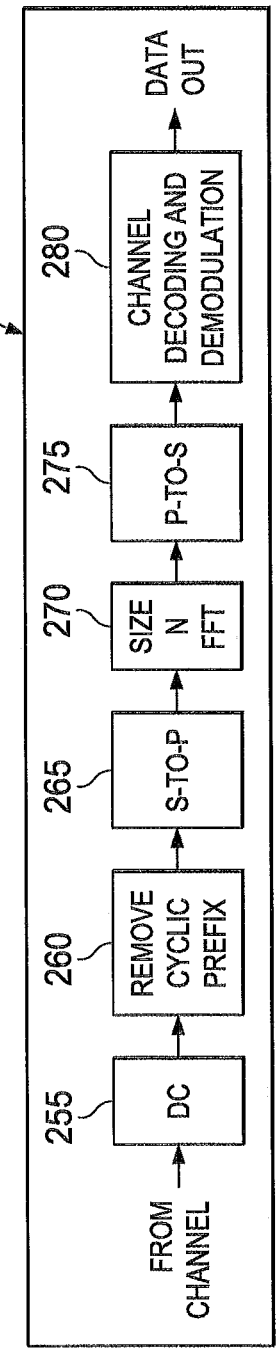
FIG. 3 illustrates a high-level diagram of an orthogonal frequency division multiple access receive path according to the present disclosure.

FIGS. 1-3 below describe various embodiments implemented in wireless communications systems and with the use of OFDM or OFDMA communication techniques. The description of FIGS. 1-3 is not meant to imply physical or architectural limitations to the manner in which different embodiments may be implemented. Different embodiments of the preset disclosure may be implemented in any suitably arranged communications system. For example, without limitation, embodiments may be implemented using one or more wired and/or optical systems.

FIG. 1 illustrates exemplary wireless system 100, which transmits messages according to the principles of the present disclosure. In the illustrated embodiment, wireless system 100 includes base station (BS) 101, base station (BS) 102, base station (BS) 103, and other similar base stations (not shown). Base station 101 is in communication with base station 102 and base station 103. Base station 101 is also in communication with Internet 130 or a similar IP-based system (not shown).

Base station 102 provides wireless broadband access (via base station 101) to Internet 130 to a first plurality of subscriber stations within coverage area 120 of base station 102. The first plurality of subscriber stations includes subscriber station 111, which may be located in a small business (SB), subscriber station 112, which may be located in an enterprise (E), subscriber station 113, which may be located in a WiFi hotspot (HS), subscriber station 114, which may be located in a first residence (R), subscriber station 115, which may be located in a second residence (R), and subscriber station 116, which may be a mobile device (M), such as a cell phone, a wireless laptop, a wireless PDA, or the like.

Base station 103 provides wireless broadband access (via base station 101) to Internet 130 to a second plurality of subscriber stations within coverage area 125 of base station 103. The second plurality of subscriber stations includes subscriber station 115 and subscriber station 116. In an exemplary embodiment, base stations 101-103 may communicate with each other and with subscriber stations 111-116 using OFDM or OFDMA techniques.

While only six subscriber stations are depicted in FIG. 1, it is understood that wireless system 100 may provide wireless broadband access to additional subscriber stations. It is noted that subscriber station 115 and subscriber station 116 are located on the edges of both coverage area 120 and coverage area 125. Subscriber station 115 and subscriber station 116 each communicate with both base station 102 and base station 103 and may be said to be operating in handoff mode, as known to those of skill in the art.

Subscriber stations 111-116 may access voice, data, video, video conferencing, and/or other broadband services via Internet 130. In an exemplary embodiment, one or more of subscriber stations 111-116 may be associated with an access point (AP) of a WiFi WLAN. Subscriber station 116 may be any of a number of mobile devices, including a wireless-enabled laptop computer, personal data assistant, notebook, handheld device, or other wireless-enabled device. Subscriber stations 114 and 115 may be, for example, a wireless-enabled personal computer (PC), a laptop computer, a gateway, or another device.

FIG. 2 is a high-level diagram of an orthogonal frequency division multiple access (OFDMA) transmit path. FIG. 3 is a high-level diagram of an orthogonal frequency division multiple access (OFDMA) receive path. In FIGS. 2 and 3, the OFDMA transmit path is implemented in base station (BS) 102 and the OFDMA receive path is implemented in subscriber station (e.g. subscriber station 116 of FIG. 1), and the OFDMA receive path 300 may be implemented in a base station (e.g. base station 102 of FIG. 1) for the purposes of illustration and explanation only.

Transmit path 200 comprises channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. Receive path 300 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

At least some of the components in FIGS. 2 and 3 may be implemented in software while other components may be implemented by configurable hardware or a mixture of software and configurable hardware. In particular, it is noted that the FFT blocks and the IFFT blocks described in this disclosure document may be implemented as configurable software algorithms, where the value of Size N may be modified according to the implementation.

Furthermore, although this disclosure is directed to an embodiment that implements the Fast Fourier Transform and the Inverse Fast Fourier Transform, this is by way of illustration only and should not be construed to limit the scope of the disclosure. It will be appreciated that in an alternate embodiment of the disclosure, the Fast Fourier Transform functions and the Inverse Fast Fourier Transform functions may easily be replaced by Discrete Fourier Transform (DFT) functions and Inverse Discrete Fourier Transform (IDFT) functions, respectively. It will be appreciated that for DFT and IDFT functions, the value of the N variable may be any integer number (i.e., 1, 2, 3, 4, etc.), while for FFT and IFFT functions, the value of the N variable may be any integer number that is a power of two (i.e., 1, 2, 4, 8, 16, etc.).

In transmit path 200, channel coding and modulation block 205 receives a set of information bits, applies coding (e.g., LDPC coding) and modulates (e.g., Quadrature Phase Shift Keying (QPSK) or Quadrature Amplitude Modulation (QAM)) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in BS 102 and SS 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal may also be filtered at baseband before conversion to RF frequency.

The transmitted RF signal arrives at SS 116 after passing through the wireless channel and reverse operations to those at BS 102 are performed. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes the modulated symbols to recover the original input data stream.

Each of base stations 101-103 may implement a transmit path that is analogous to transmitting in the downlink to subscriber stations 111-116 and may implement a receive path that is analogous to receiving in the uplink from subscriber stations 111-116. Similarly, each one of subscriber stations 111-116 may implement a transmit path corresponding to the architecture for transmitting in the uplink to base stations 101-103 and may implement a receive path corresponding to the architecture for receiving in the downlink from base stations 101-103.

The various embodiments of the present disclosure recognize that use of long LDPC codes can improve error performance. However, the various embodiments of the present disclosure recognize that design of LDPC code families with different code lengths that can be decoded using the same hardware can be challenging. The various embodiments of the present disclosure further recognize that the design of LDPC code families with different code lengths while reducing decoding complexity and power consumption may also be challenging. Thus, the various embodiments of the present disclosure provide LDPC code designs for improving error performance while limiting complexity and power consumption in decoding.

In an exemplary embodiment, a design for a LDPC code according to the present disclosure may be derived from a method where by a LDPC base code with code length 'n' is lifted by a lifting factor 'Zp'. The method includes identifying a protograph corresponding to each code in the LDPC mother family code. The mother code in the family is the code having the highest rate. The method further includes design a protograph for each code having a length equal to the lifting factor times the base code length. In these examples, the method chooses a lifting that reduces the number of cycles of size four in the resulting protograph. The method further includes derive the base matrices for the codes by replace each zero in the protograph by an all-zeros matrix of the size of the expansion factor 'Z', and replace every the ones in the protograph with the corresponding value in the base matrix of the corresponding code in the mother family.

Figures 4A, 4B:
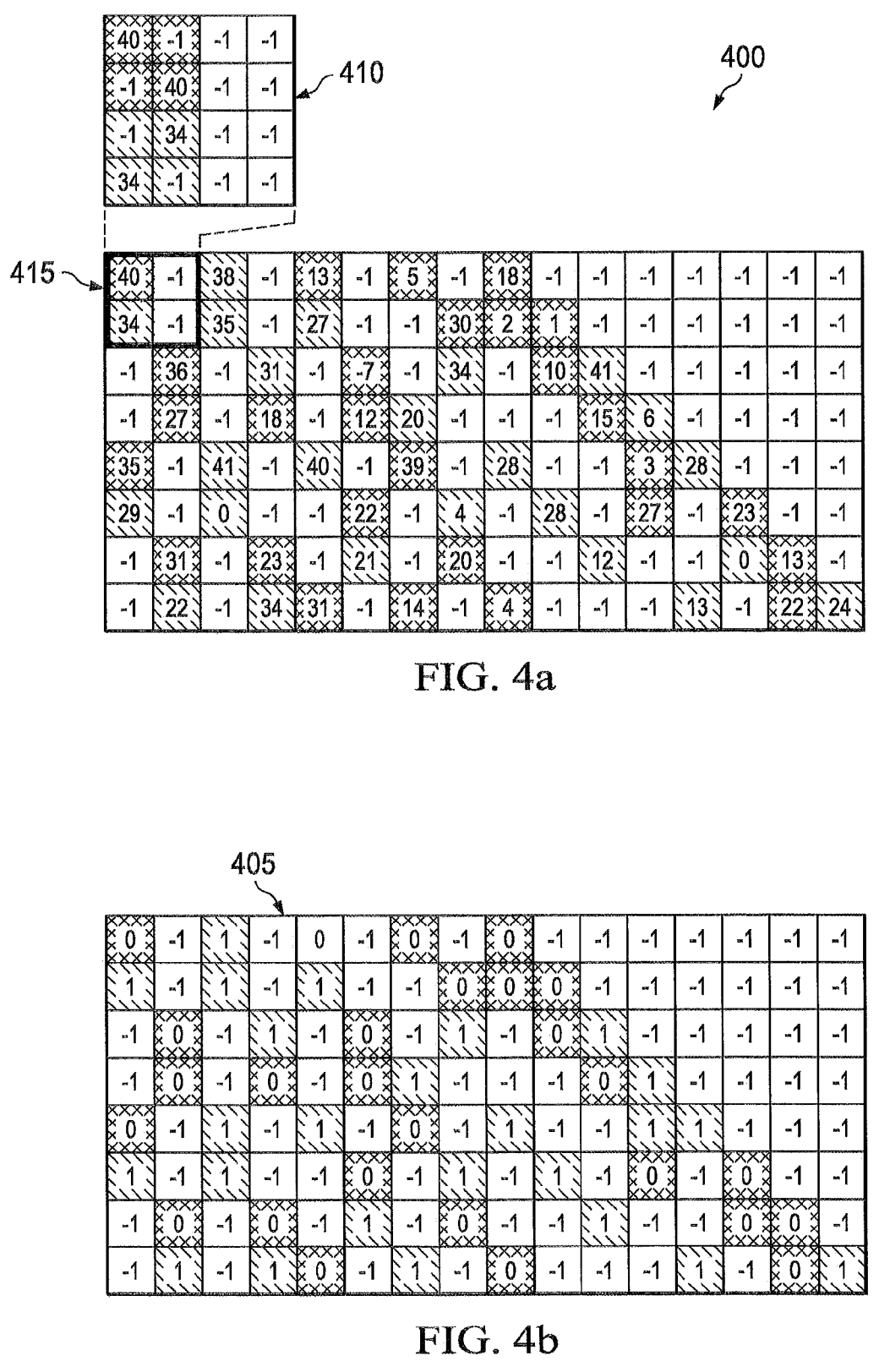

FIGS. 4*a*-*b* illustrate LDPC code lifted by a lifting factor of two according to the present disclosure. In this illustrative example, base code 400 is LDPC code that has a length of 672 bits and a code rate of one half. In some examples, base code 400 may correspond with the length 672-bit Wireless Gigabit Alliance (WiGig) standard of wireless communication. Base code 400 may be derived using the method described above.

FIG. 4*b* illustrates a lifting block 405 for lifting base code 400 by a lifting factor of two. In lifting block 405, all the '1' entries denote circular shift by one, and all the '0' entries denote no shift. FIG. 4*a* additionally illustrates a method for deriving a length 1344-bit LDPC code from base code 400. Lifted LDPC code 410 illustrates portion 415 of base code 400 lifted by a lifting factor of two using lifting block 405. Lifting base code 400 using lifting block 405 results in a length-1344 LDPC code. For example, the '40' circular shift in portion 415 the new corresponding 1344-bit matrix entry in lifted LDPC code 410 has no shift since the entry on the '40' in lifting block 405 was '0'. However, for the '34' circular shift in base code 400 with 672-bit length, lifted LDPC code 410 for the new corresponding 1344-bit code has a circular shift by 1 since the '34' in lifting block 405 was '1'.

Note that the method for lifting base code 400 above preserves the properties of the base-family. That is, the new LDPC code family inherits its structure, threshold, row weight, column weight, and other properties from the base-family. Moreover, the number of non-zero elements in the new codes increases linearly with Zp. As the number of information bits also increases linearly with Zp, the decoding complexity per bit stays the same.

In some embodiments, structured LDPC code families and LDPC code designs using expansion factors may be formed as described in one or more of U.S. patent application Ser. No. 12/855,442, filed on Aug. 12, 2010, and entitled "SYSTEM AND METHOD FOR STRUCTURED LDPC CODE FAMILY WITH FIXED CODE LENGTH AND NO PUNCTURING" and U.S. patent application Ser. No. 12/876,903, filed on Sep. 7, 2010, and entitled "SYSTEM AND METHOD FOR STRUCTURED LDPC CODE FAMILY".

Figure 5A:
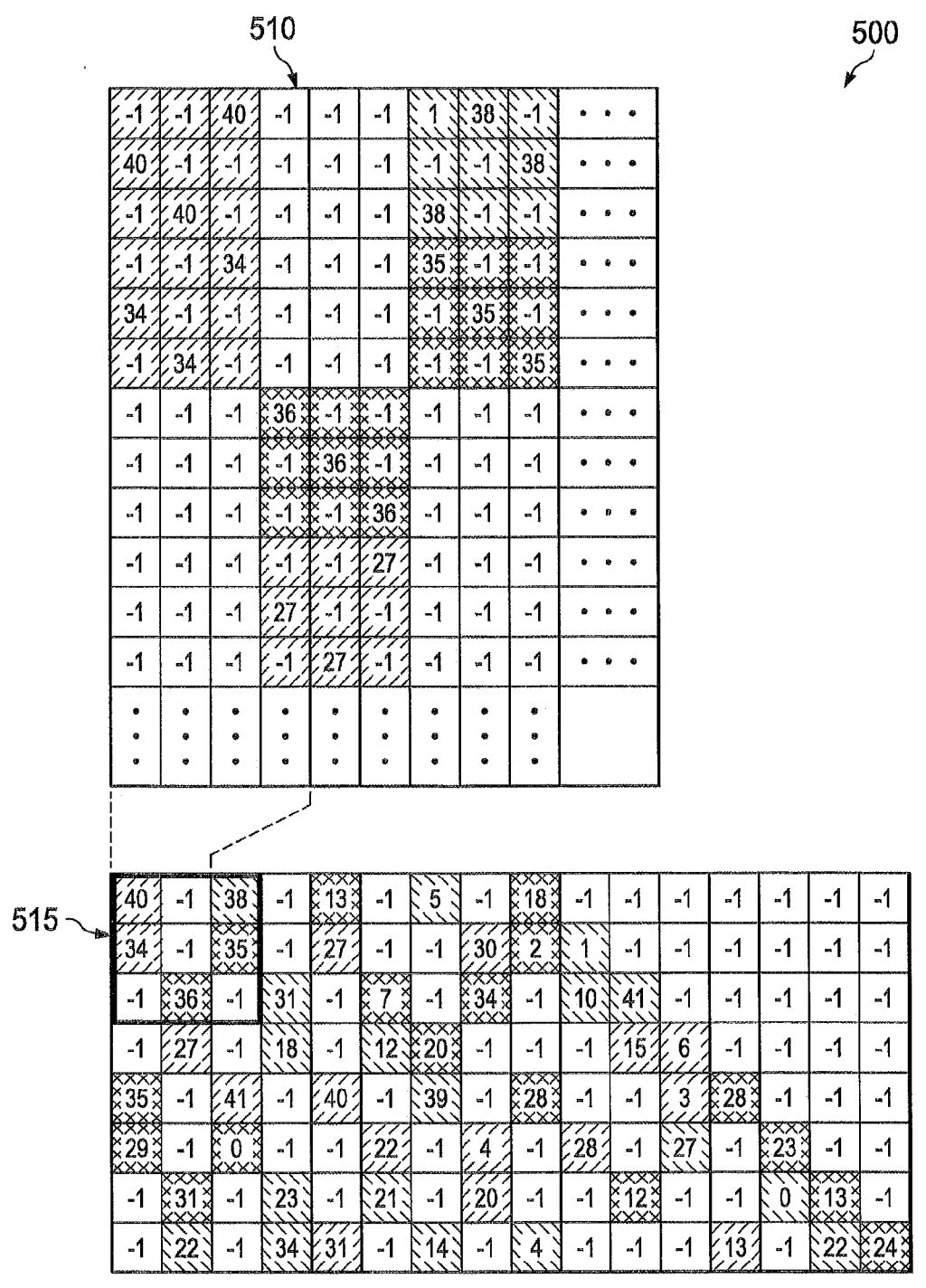

FIGS. 5a-b illustrate LDPC code lifted by a lifting factor of three according to the present disclosure. In these illustrative examples, base code 500 is LDPC code which correspond to the length 672-bit WiGig LDPC code of rate one half. FIG. 5b illustrates lifting block 505 for lifting base code 500 by a lifting factor of two. In lifting block 505, the '2' entries denote circular shift by two, the '1' entries denote circular shift by one, and the '0' entries denote no shift. Lifted LDPC code 510 illustrates portion 515 of base code 500 lifted by a lifting factor of three using lifting block 505. Lifting base code 500 using lifting block 505 results in a length-2016 LDPC code.

LDPC decoding methods can be divided into two main categories: flooding (e.g. parallel) decoding and Layered (e.g. serial) decoding. Flooding decoding ignores row contentions to increase parallelism. Flooding decoding can achieve faster decoding but uses more hardware when compared with layered decoding. Layered decoding use information accumulated between row processing. Layered decoding may require more cycles to process per iteration, however it requires significantly fewer iterations to converge (e.g. >33% less iterations) to the same block error rate (BLER) performance as flooding. The various embodiments of the present disclosure utilize both flooding and layered decoding methods accompanied by the LDPC code designs described above to improve error performance while considering power consumption and decoding complexity.

FIG. 6 illustrates a block diagram of a LDPC decoder present disclosure. In these illustrative examples, decoder 600 is one implementation of a hardware architecture that can be utilized to decode LDPC codes designed as described above. In some examples, decoder 600 may be implemented in a receiver such as receive path 200 in FIG. 2.

Decoder 600 includes memory 605, switch 610, and number of LDPC processing elements 615. Memory 605 stores LDPC codewords when encoded codewords have been received and when decoded codewords have been decoded. Switch 610 transfers and receives LDPC codewords to and from LDPC processing elements 615.

In this illustrative embodiment, LDPC processing elements 615 may process LDPC code using flooding and layered decoding methods. For example, LDPC processing elements 615 decode received LDPC code using a parity check matrix that may be sorted in memory 605. LDPC processing elements 615 can include any number of processing elements. In some embodiments, the number of processing elements in LDPC processing elements 615 is equal to the lifting factor of the LDPC code.

For example, LDPC processing elements 615 may include three LDPC processing element. Ordinarily, three received LDPC codewords of length 672 may be processed in parallel by three separate processing elements to meet throughput requirements (e.g. 4.6 Gbps in WigGig v1.0). However, utilizing the code structure of the present disclosure, the three processing elements in LDPC processing elements 615 can each decode codewords of length 2016 to achieve better BLER performance and have higher power efficiency.

FIG. 7 illustrates a block diagram of LDPC decoder architecture for a flooding method of decoding according to the present disclosure. In this illustrative example, decoder 700 is an example of one implementation of decoder 600 in FIG. 6. Decoder 700 is one implementation of a hardware architecture that can be utilized to decode LDPC codes using flooding. As discussed above, the flooding method processes rows in parallel which allows faster decoding. In this example, LDPC decoders 705, 710, and 715 are working in parallel. Each LDPC decoder 705, 710, and 715 processes one third of the H-Matrix rows.

Dispatch and sum element 720 dispatches all 2016 bits to each of LDPC decoders 705, 710, and 715. Buffer 725 stores encoded and decoded bits prior to and after decoding. The bits may be considered "soft" bits because they represent the probability of being a '1' or '0'. In this example, LDPC code lengths of 2016 bits and three LDPC decoder blocks are used. In other examples, any code length and numbers of LDPC decoder blocks may be used in accordance with the teachings of the present disclosure.

Figure 8:
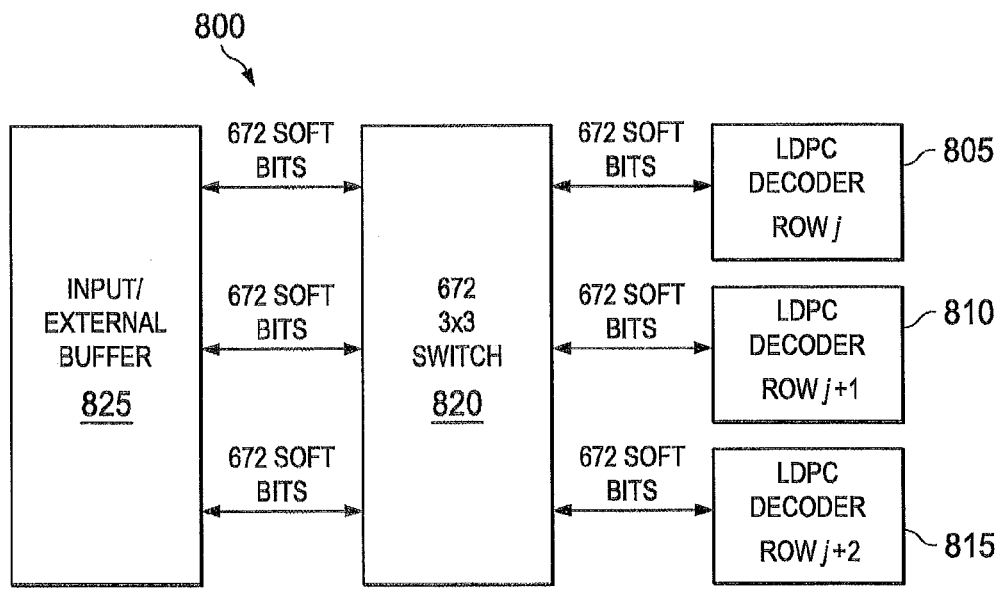
FIG. 8 illustrates a block diagram of LDPC decoder architecture for a layered method of decoding according to the present disclosure.

FIG. 8 illustrates a block diagram of LDPC decoder architecture for a layered method of decoding according to the present disclosure. In this illustrative example, decoder 800 is an example of one implementation of decoder 600 in FIG. 6. Decoder 800 is one implementation of a hardware architecture that can be utilized to decode LDPC codes using layered decoding.

The LDPC Layered system illustrated in decoder 800 decodes a single 2016-bit codeword with three 672-bit LDPC decoding processors in parallel in order to meet the throughput requirements. In one example, the throughput may be higher than 4.6 Gbps (MCS-12) with 100 MHz clock. The LDPC codes of the present disclosure have no contention between the N rows, so each LDPC decoders 805, 810, and 815 decodes a separate row at a time. Thus, neither throughput reduction nor field error rate (FER) performance degradation is introduced with the architecture of decoder 800.

Switch 820 dispatches 672 bits to each of LDPC decoders 805, 810, and 815. For example, switch sends every $j^{th}$ row is to LDPC decoder 805, every $j^{th}+1$ to LDPC decoder 810, and every $j^{th}+2$ to LDPC decoder 815. Buffer 825 stores encoded and decoded bits prior to and after decoding. In this example, LDPC code lengths of 2016 bits and three LDPC decoder blocks are used. In other examples, any code length and numbers of LDPC decoder blocks may be used in accordance with the teachings of the present disclosure.

Figure 9:
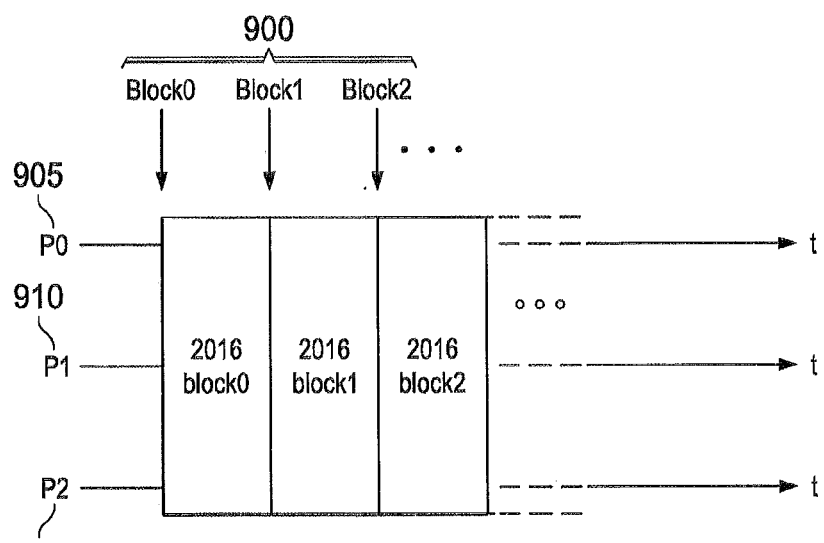
FIG. 9 illustrates a scheduling diagram for processing LDPC codewords according to the present disclosure.

FIG. 9 illustrates a scheduling diagram for processing LDPC codewords according to the present disclosure. In this example, schedule 900 illustrates scheduling of processing a single 2016-bit codeword in order to support throughput requirements (e.g. higher than 4.6 Gbps). As discussed above, a single 2016 bit codeword can be processed by processing elements 905, 910, and 915 in parallel with no contention, since each processing elements process a different row the rows are independent. Although the code length is three times as long, the code design of the present disclosure increases code length while maintaining a similar level of coding complexity. Thus, the processing architecture of the present disclosure can decode longer lengths of code in about the same time as would ordinarily be required to process the shorter length of code. As a result, the processing architecture of the present disclosure can maintain throughput requirements while improving error performance and power efficiency.

The various embodiments of the present disclosure recognize that reducing shift functions needed in decoding LDPC code can result in a reduction in hardware complexity. As discussed above, LDPC code may be processed using flooding or layered decoding methods. For example, in a layered decoder the same check node processing hardware is used to process different layers of the code. Each layer corresponds to one row of the H-matrix, and therefore consists of Z parity checks. In order to share the check node processing hardware, right cyclic shift and left-cyclic-shift hardware functions may need to be implemented in hardware. For a given H-matrix column, the hardware must be able to perform each of the possible right-cyclic-shifts and complementary left-cyclic-shifts.

In order to obtain code with good error performance, the various embodiments of the present disclosure recognize that is necessary to vary the shift value used to create each Z by Z sub-matrix. Doing this connects different bits of the codeword to each of the check nodes in a complex way which results in good performance, but increases hardware complexity. The various embodiments of the present disclosure provide ways to reduce the hardware complexity associated with these shift functions in order to achieve a number of performance advantages.

Figure 10:
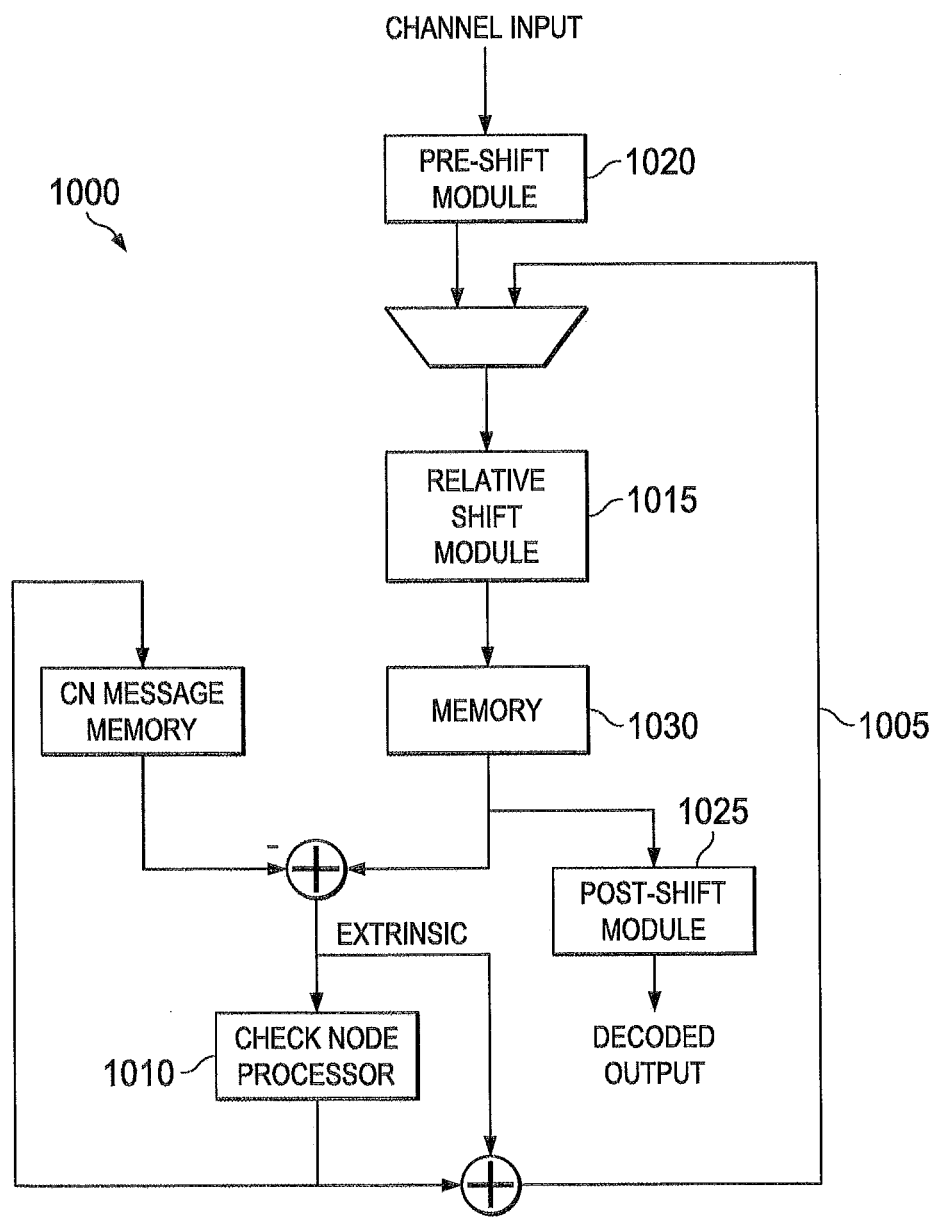
FIG. 10 illustrates a diagram of a LDPC decoder according to the present disclosure.

FIG. 10 illustrates a diagram of a LDPC decoder according to the present disclosure. Decoder 1000 includes decoding loop 1005 by which check-node processor 1010 can iteratively process layers of LDPC code. In this illustrative embodiment, relative-shift module 1015 is included within decoding loop 1005. Relative-shift module 1015 performs relative shifts of values in the LDPC code rather than absolute shifts. Instead of using the absolute-shift values of the H-matrix which requires applying an absolute value of one layer in one direction before processing and then shifting the same layer back after processing, relative-shift module 1015 applies a relative shift which is equal to the difference between the next layer's required shift and the current layer's shift value. For example, relative-shift module 1015 may only apply right shifts to each layer. In this manner, only one relative shift is performed in decoding loop 1005.

Because the shift function is cyclic, the absolute-shift values can "wrap around" to zero when the value of Z is exceeded. In mathematical terms, given a relative-shift value of R, the sequence of absolute-shift values S for a particular column with column weight '$w_c$' is represented by equation 1 listed below.

$$S_m = \left(\sum_{i=0}^{m} R_i\right) \bmod Z \qquad \text{[Equation 1]}$$

where m is the column number from zero to the column weight, the sigma is the summation of shift values for a column from a first value (i=0) to the current column number, and mod Z refers to the absolute shift value returning towards zero when the value of Z is exceeded, as discussed above.

Decoder 1000 further includes pre-shift module 1020 and post-shift module 1025 that are outside of decoding loop 1005. Pre-shift module 1020 a pre-shift value applied to the channel data before loaded into memory 1030. The pre-shift value is used once, outside of decoding loop 1005.

Post-shift module 1025 applies post-shift values outside of the decoding loop 1005 after the code is decoded. The post-shift values can align the data received at decoder 1000 the unshifted state. Since pre-shift module 1020 and post-shift module 1025 are outside of the decoding loop 1005, they have reduced impact on the throughput of decoder 1000. Limiting the number of shifts performed in decoding loop 1005 improves processing throughput of decoder 1000.

Decoder 1000 also provides support for layered early termination. For example, when used in a layered decoder, post-shift module 1025 can include all the shift possibilities required to align the bit log-likelihood ratios (LLRs) after any layer or sub-iteration is completed, without adding to the time required to process a layer in decoder 1000. The ability of decoder 1000 to stop after any layer is referred to as layered early termination. Layered early termination can result in additional improvement in throughput and power consumption, since decoder 1000 does not always have to run to the end of a full iteration.

Figure 11:
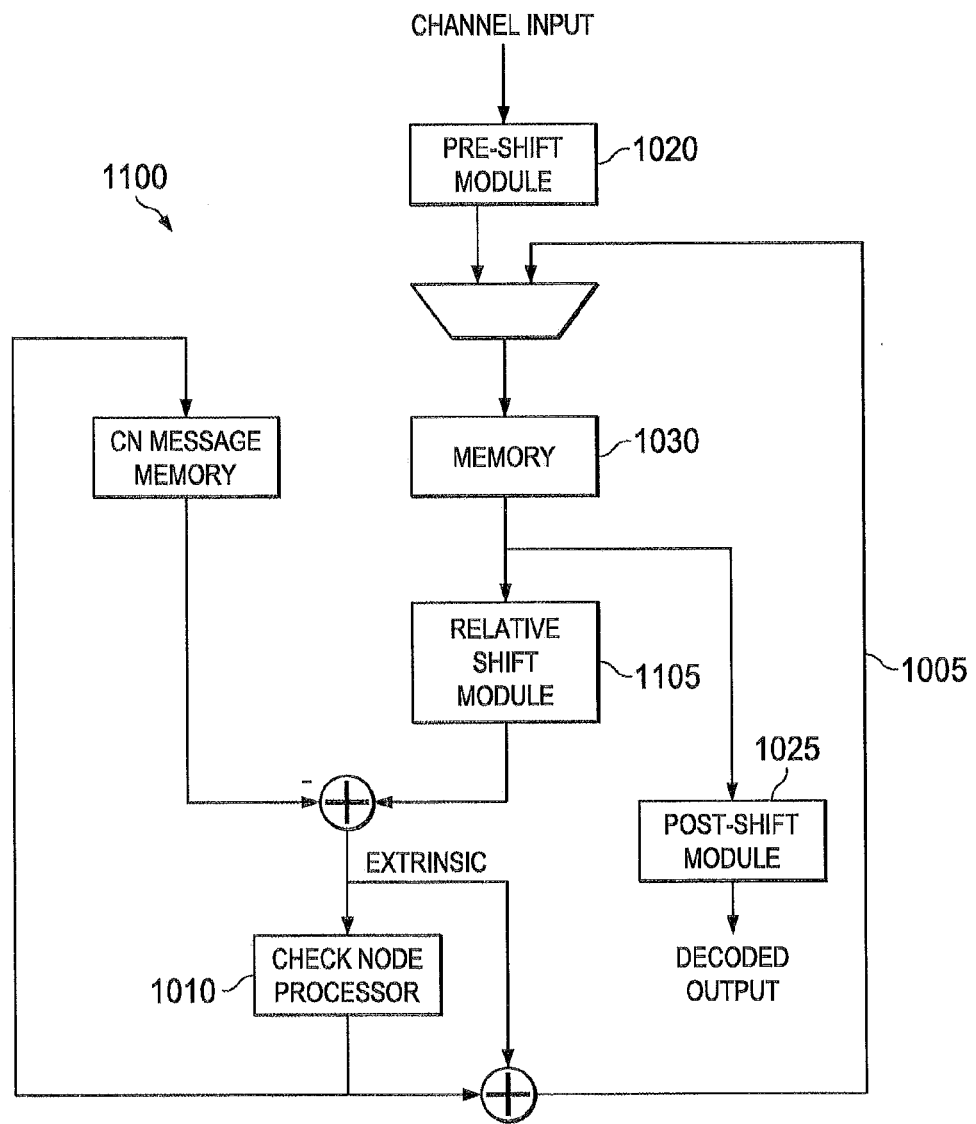
FIG. 11 illustrates another diagram of a LDPC decoder according to the present disclosure.

In this illustrative embodiment, relative-shift module 1015 is positioned before memory 1030 in decoding loop 1005. Thus, relative-shift module 1015 performs write shifts as the LDPC code is written to memory 1030. FIG. 11 illustrates another diagram of a LDPC decoder according to the present disclosure. In this illustrative embodiment, decoder 1100 is an example of one implementation of decoder 1000 in FIG. 10. However, in decoder 1100, relative-shift module 1105 is positioned after memory 1030 in decoding loop 1005. Thus, relative-shift module 1015 performs read shifts as the LDPC code is read from memory 1030. Decoders 1000 and 1100 reduce the amount of shift logic in the decoder path, and therefore will use less power. Decoders 1000 and 1100 also reduce an amount of shift path delay.

The various embodiments of the present disclosure recognize and take into account that efficient shift hardware designs in LDPC code can be advantageous. The various embodiments of the present disclosure recognize that code design and use of the shift values in the H-matrix can improve the efficiency of hardware shift functions. Instead of starting with a given LDPC code designed solely for error rate performance, parallelization, and throughput, the various embodiments of the present disclosure add a constraint to the code design based on knowledge of efficient hardware implementations of shift functions. Codes designed according to the present disclosure will allow decoder hardware to maintain error rate and parallelization performance expectations while providing lower power and higher throughput.

Figure 12A:
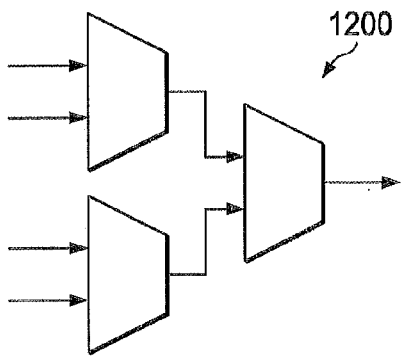
FIGS. 12a-12c illustrate diagrams of shifting element configurations according to the present disclosure.
Figure 12B:
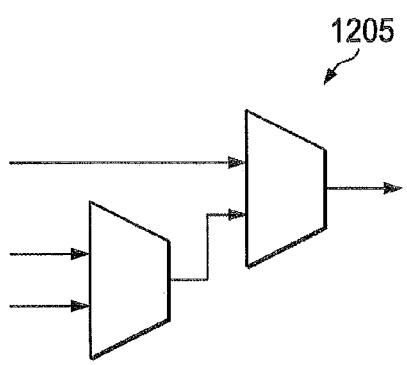
Figure 12C:
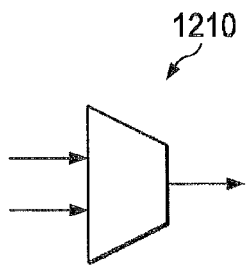

FIGS. 12a-12c illustrate diagrams of shifting element configurations according to the present disclosure. In the hardware implementation of a LDPC decoder, the cyclic-shift functions are typically constructed with multiplexers. For example, the multiplexers may be created from CMOS logic or pass-transistor logic. FIG. 12a illustrates shifting element 1200 for performing four shifts. As illustrated, four shifts performed uses two layers and three multiplexers. FIG. 12b illustrates shifting element 1205 for performing three shifts. As illustrated, three shifts performed uses two layers and two multiplexers. FIG. 12c illustrates shifting element 1205 for performing two shifts. As illustrated, two shifts performed uses one layer and one multiplexer.

The various embodiments of the present disclosure recognize and take into account that logic for the layers of multiplexer adds to the processing delay for processing each layer of the code. This delay limits the operating frequency of the check-node processors, which in turn reduces the throughput of the decoder. The increase in number of multiplexers can increase size in silicon and power consumption of the decoder. However, the various embodiments of the present disclosure also recognize and take into account that a reduction in the number of shifts in the code can hurt the error performance of the decoder. The various embodiments of the present disclosure provide designs for LPDC code families that maintain the error rate and parallelization performance expectations while providing lower power and higher throughput.

The various embodiments of the present disclosure recognize that implementing one cyclic shift in hardware is almost free of cost. This is because one shift can be implemented by simply changing the interconnect ordering between variable nodes 'VNs' and check nodes 'CNs'. Additionally, the various embodiments of the present disclosure recognize that when creating the H-matrix for a code where the absolute-shift values in consecutive rows of the same column are equally spaced, the hardware only needs to implement one relative shift per column.

Figure 13:
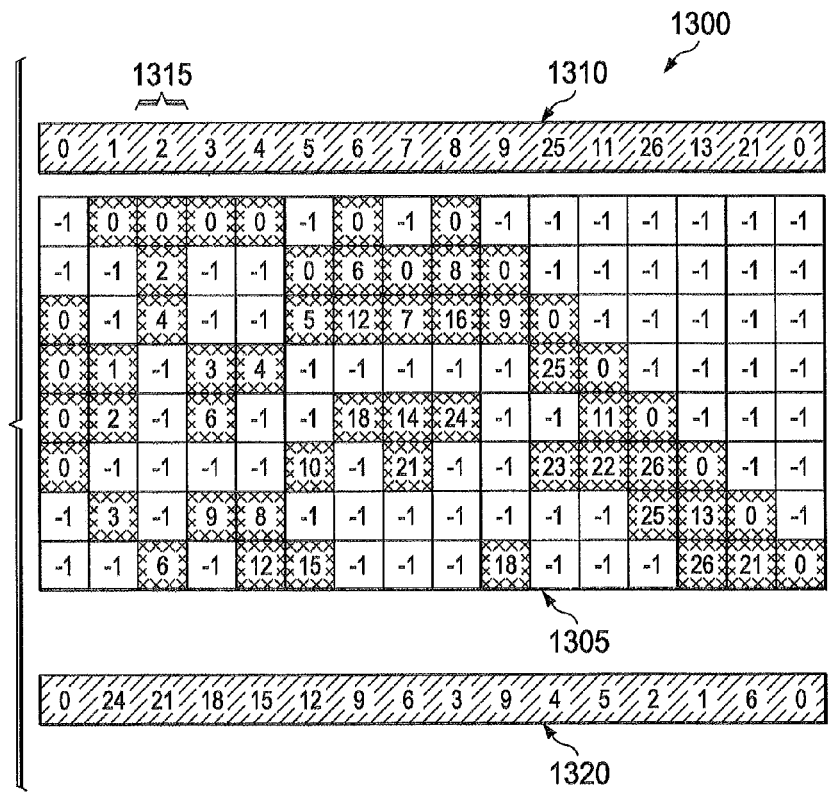
FIG. 13 illustrates LDPC code having a single relative shift and an inter-iteration shift according to the present disclosure.

FIG. 13 illustrates LDPC code having a single relative shift and an inter-iteration shift according to the present disclosure. LDPC code 1300 is an example of LDPC code with 16 columns in the base H-matrix, a Z-factor of 27, and codeword length 432. Within each column, all cyclic-shifts are described by first cyclic-shift value 1305 and the set of relative-shift values 1310. For example, in column 1315, the first cyclic-shift value is '0' and the relative-shift value is '2'. Thus, the cyclic shifts in column 1315 are '0', '2', '4', and '6'. For each column, a different relative-shift value is chosen in order to avoid short cycle lengths within the code.

In the embodiment illustrated by FIG. 13, the shift hardware has one relative shift per column. For a layered decoder, this results in a different absolute-shift value for each layer. Since the relative-shift value R is constant for a given column, the sequence of absolute-shift value S available for that column can be found by equation 2.

$$S_m = (Rm) \bmod Z \qquad \text{[Equation 2]}$$

where m is the column number from zero to the column weight.

In order to achieve the desired shift function in hardware, the number of different shift values set of relative-shift values 1310 for each column of the H-matrix can be increased. The minimum number of shift values possible is one, where the shift value can be anything from zero to Z minus one. The various embodiments of the present disclosure recognize and take into account that that one absolute shift per column may result in the data from each layer being connected to the check nodes in the same way. In other words, instead of linearly independent parity checks, the same parity checks would be repeated many times in the code. Such a code can have poor error performance.

The various embodiments of the present disclosure recognize that implementing one relative shift per column changes this situation. Although the hardware implements only one shift value per H-matrix column, since the shift is relative to the previous layer, each layer within a column can have a unique absolute-shift value. If the relative-shift value is carefully chosen for each column, the error rate performance of the resulting code meet or exceed desired expectations.

In terms of hardware complexity, allowing one shift value per column is almost free of cost. Implementing a single shift only requires changing the connections between the variable nodes and the check nodes. The need for additional gates, multiplexes, or switches in hardware is reduced.

In order to support iterative decoding, it may be necessary to have one additional relative-shift value per column. This additional relative shift may be needed so that variable data from the final layer of one iteration is aligned properly for the first layer of the next iteration. As an example, in column 1315 a relative right shift of 21 may be used to align the final VN data of one iteration to the CNs of the next iteration. Set of inter-iteration values 1320 provides the additional relative shift for each column in LDPC code 1300. The inter-iteration value for each column may be calculated according to equation 3 below.

$$F = (Z - S_{W_c}) \bmod Z \qquad \text{[Equation 3]}$$

where $S_{W_c}$ is the final absolute-shift value in the column.

As shown in LDPC code 1300, embodiments of present disclosure constrain the shift values which can appear in any given column of the H-matrix. In some embodiments, it may not be necessary to constrain each column to just one relative-shift value. For example, each column may be limited to two, three, or some other fixed number of shifts. Loosening the constraint provides a greater degree of freedom in creating the code at the expense of additional hardware required to implement the increased number of relative-shift possibilities. The greater degree of freedom in designing the code could be used to create codes with greater column weights or improve the error rate performance.

Figure 14:
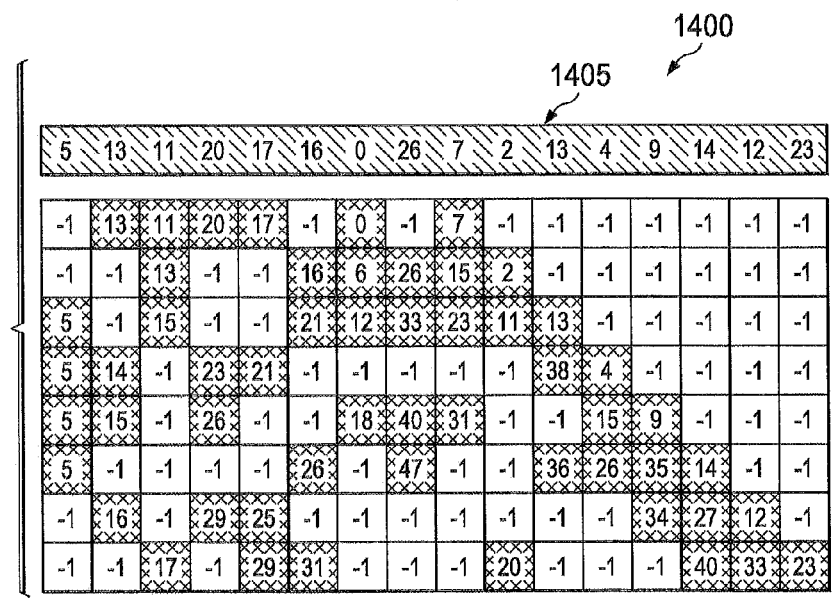
FIG. 14 illustrates LDPC code having a single relative shift and a shift offset according to the present disclosure.

FIG. 14 illustrates LDPC code having a single relative shift and a shift offset according to the present disclosure. LDPC code 1400 is an example of LDPC code 1300 in FIG. 13 having set of shift offset values 1405. Independent of the relative-shift value used for each H-matrix column, the first valid shift entry of any column can contain a shift value from zero to Z–1. This shift can be thought of as an offset applied to all of the shift values in one column.

Shift offset values 1405 do not affect the structure or minimum cycle size of the code. Since shift offset values 1405 are a single shift value per column of a modification of the interconnect ordering between the channel data input and the variable nodes, implementing the shift offset is low cost in terms of hardware use. Such an offset does not negatively affect the structure of the code or characteristics such as the size and number of cycles. The offset also does not affect the performance of the code over standard communication channels.

This shift offset could be used to improve the error rate performance of the code under certain channel conditions, similar to the effect of data interleaving. For example, improvements may be recognized in hardware impairments which produce periodic error patterns in the received VN data. Shift offset values 1405 can be applied to the channel data once, before processing begins in the decoder, and therefore does not affect the throughput of the decoder.

Figure 15:
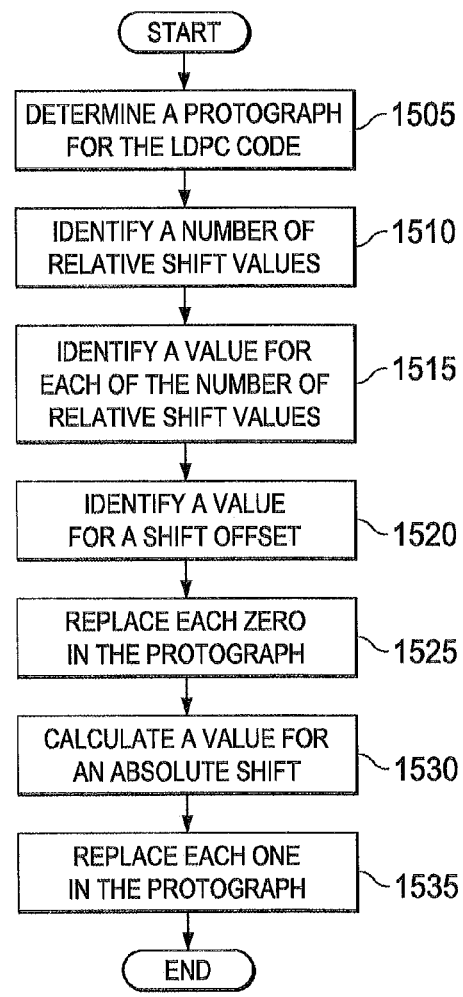
FIG. 15 illustrates a process for constructing a LDPC code according to the present disclosure.

FIG. 15 illustrates a process for constructing a LDPC code according to the present disclosure. The process may be implemented by any suitable encoder such as for example channel coding and modulation block 205 in FIG. 2. The process may also be implemented in any suitably arranged mobile station or base station in a wireless communication system.

In block 1505, the process begins by determining a protograph for the LDPC code. The process may also set the maximum column weight for the LDPC code. Given a code length, a Z-factor, and a code rate determine the number of VNs and CNs in the protograph. For example, a protograph-based exit analysis may be used to design a protograph with good iterative decoding threshold, and which satisfies the wmax constraint given In block 1510, the process then identifies a number of relative-shift values per column of the LDPC code. Thereafter, in block 1515, the process identifies a value for each of the number of relative-shift values. In block 1520, the process then identifies a value for a shift offset for each column. Based on the number and value(s) for the relative shift and the shift-offset value the process then constructs the base matrix for each column one row at time. In block 1525, the process then replaces each zero in the protograph with a '−1'.

Thereafter, in block 1530, the process calculates a value for an absolute shift for each one in the protograph. The value for an absolute shift can be calculated based on the number of relative-shift values per column, the value for each of the number of relative shift values, and a Z-factor for the LDPC code. For example, for each column, the absolute-shift value for a row may be calculated according to equation 4 below.

$$\text{for } n=\{1, \ldots, w_c\}: S_n=(S_{n-1}+X_n) \bmod Z, \quad \text{[Equation 4]}$$

Where n is the number of the row in the column, $S_n$ is the absolute-shift value for the row, and $X_n$ is the value for the relative shift for the column. If the column has more than one relative shift, $X_n$ will be the value for the relative shift being applied to the present row.

In block 1535, the process then replaces each one in the protograph with the value. Blocks 1530 and 1535 may be repeated for each row in the column and then for each column in the protograph. Additionally, the process may calculate the inter-iteration shift value for the column according to equation 3 discussed previously.

Upon construction of the code, the code performance can be evaluated through simulation or testing. For example, if performance does not meet desired expatiations the relative-shift value(s) for a particular column can be changes and the process may repeat blocks 1530 and 1535 for the new relative-shift value(s). The number of relative-shift values may also be increased and the blocks 1530 and 1535 repeated for the additional relative-shift value(s).

A code family consisting of codes with the same codeword length and Z-factor but with different code rates can be designed using the approach of constraining the relative shift for each column as described with regard to FIGS. 13-15 above. The code families can be designed so that all code rates utilize the same relative-shift value in a given column.

FIGS. 16a-16c illustrate a LDPC code family having a single relative shift and different code rates. In these illustrative examples, LDPC code 1600 in FIG. 16a has a rate of one half, LDPC code 1605 in FIG. 16b has a rate of one five eighths, and LDPC code 1610 in FIG. 16c has a rate of three fourths. In this example, LDPC codes 1600, 1605, and 1610 are constructed with the same codeword length, Z-factor, and using the same relative-shift constraints on each column.

It is also possible to extend the code family to codeword lengths which are a multiple of the base code length. This can be done through applying a lifting factor as described above. As discussed above, the decoding processors according to embodiments of the present disclosure can utilize the same relative-shift value in a given column for all supported code sizes. As a result, additional levels of lifting do not change the decoder hardware design or the performance of the base code.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An apparatus for decoding a low density parity check (LDPC) code, the apparatus comprising:
   a memory configured to receive a LDPC codeword having a length equal to a lifting factor times a base LDPC code length, wherein the lifting factor is greater than one; and
   a number of LDPC processing elements configured to decode the LDPC codeword, wherein each of the number of LDPC processing elements decode separate portions of the LDPC codeword,
   wherein, when the LDPC processing elements decode in parallel, a first LDPC processing element in the LDPC processing elements is configured to receive the LDPC codeword and decode a fraction of a total number of rows in the LDPC code, the fraction equal to one over the number of the LDPC processing elements.

2. The apparatus of claim 1, wherein each of the number of LDPC processing elements is configured to decode a portion of the LDPC codeword having a length equal to the base LDPC code length within a period of time needed to decode an LDPC codeword having the base LDPC code length.

3. The apparatus of claim 1, wherein, when the LDPC processing elements perform layered decoding of the LDPC codeword, each LDPC processing element in the LDPC processing elements is configured to:
   receive a portion of the LDPC codeword having a length equal to the base LDPC code length; and
   perform layered decoding of the received portion of the LDPC codeword.

4. The apparatus of claim 1, wherein the base LDPC code length is 672 and wherein the lifting factor is one of 2 and 3 and wherein the number of LDPC processing elements is equal to the lifting factor.

5. A method for decoding a low density parity check (LDPC) code, the method comprising:
   receiving a LDPC codeword having a length equal to a lifting factor times a base LDPC code length, wherein the lifting factor is greater than one; and
   decoding, using the number of LDPC processing elements, the LDPC codeword, wherein each of the number of LDPC processing elements decode separate portions of the LDPC codeword, wherein, when the LDPC processing elements decode in parallel, decoding the LDPC codeword comprises:
     receiving, at a first LDPC processing element a first LDPC processing element in the number of LDPC processing elements, the LDPC codeword; and
     decoding a fraction of a total number of rows in the LDPC code, the fraction equal to one over the number of the LDPC processing elements.

6. The method of claim 5, wherein decoding the LDPC codeword further comprises:
   decoding the LDPC codeword with a minimum decoder throughput of 4.6 gigabits per second.

7. The method of claim 5, wherein, when the LDPC processing elements perform layered decoding of the LDPC codeword, decoding the LDPC codeword comprises:
- receiving, at each LDPC processing element in the LDPC processing elements, a portion of the LDPC codeword having a length equal to the base LDPC code length; and
- performing, using the LDPC processing elements, layered decoding of the received portion of the LDPC codeword.

8. The method of claim 5, wherein:
- the LDPC codeword is formed by increasing the base LDPC code length of the LDPC code by the lifting factor without increasing a decoding complexity of the LDPC code, and
- decoding the LDPC codeword further comprises decoding, by each of the number of LDPC processing elements, a portion of the LDPC codeword having a length equal to the base LDPC code length within a period of time needed to decode a LDPC the codeword having the base LDPC code length.

9. The method of claim 5, wherein the base LDPC code length is 672 and wherein the lifting factor is one of 2 and 3, wherein the number of LDPC processing elements is equal to the lifting factor.

* * * * *